United States Patent [19]

Bruccoleri et al.

[11] Patent Number: 5,748,128
[45] Date of Patent: May 5, 1998

[54] REDUCED CURRENT QUADRATIC DIGITAL/ANALOG CONVERTER WITH IMPROVED SETTLING-TIME

[75] Inventors: Melchiorre Bruccoleri, Genova; Marco Demicheli, Binago; Giuseppe Patti, Favara; Valerio Pisati, Bosnasco, all of Italy

[73] Assignee: SGS-Thomson Microelectronics, S.r.l., Agrate Brianza, Italy

[21] Appl. No.: 645,457

[22] Filed: May 13, 1996

[30] Foreign Application Priority Data

May 15, 1995 [EP] European Pat. Off. ............ 95830197

[51] Int. Cl.$^6$ ................................................... H03M 1/16
[52] U.S. Cl. ............................. 341/144; 341/145; 341/146; 341/131; 341/135
[58] Field of Search .............................. 341/146, 144, 341/135, 131, 145

[56] References Cited

U.S. PATENT DOCUMENTS

| 3,685,045 | 8/1972 | Pastoriza | 340/347 |
|---|---|---|---|
| 4,168,528 | 9/1979 | Comer . | |
| 4,408,190 | 10/1983 | Nagano | 340/347 |
| 5,070,331 | 12/1991 | Hisano | 341/154 |

FOREIGN PATENT DOCUMENTS 0413271  2/1991  European Pat. Off. .

OTHER PUBLICATIONS

E.D.N. Electrical Design News, vol. 27, No. 10, 12 May 1982, Boston, Mass. Tomey, "Improved function generators with matched D/A converters.".

IEEE Proceedings, vol. 128, No. 2, G., Apr. 1981, Old Woking, Surrey, G.B., pp. 91–92. Zurada, "Application of multiplying digital-to-analogue convertor to digital control of active filter characteristics.".

Primary Examiner—Jeffrey A. Gaffin
Assistant Examiner—Jason H. Vick
Attorney, Agent, or Firm—Robert Groover; Betty Formby; Matthew S. Anderson

[57] ABSTRACT

A digital/analog quadratic converter (DACQ) composed by a pair of linear converters connected in cascade has a direct coupling of the output node of the first converter (DAC1) with a node of a R-2R type resistive network of the second converter (DAC2) corresponding to the LSB stage of the R-2R type resistive network. High impedance nodes, notably the input node of the second linear converter, are advantageously eliminated from the "current path" thus markedly reducing the problems of relatively long settling times of high impedance nodes (having intrinsically large parasitic capacitances associated therewith). The peculiar architecture of the quadratic converter provides also for a remarkable simplification of the circuit.

20 Claims, 6 Drawing Sheets

REDUCED CURRENT QUADRATIC DIGITAL/ANALOG CONVERTER WITH IMPROVED SETTLING-TIME

FIELD OF THE INVENTION

This invention relates to circuits for converting digital data into analog signals. More specifically, it involves a digital/analog quadratic converter that is formed by two digital/analog linear converters of the current-scaling type, functionally connected in cascade, providing an analog output defined by a quadratic function of a digital datum applied to the converter.

BACKGROUND OF THE INVENTION

Variables such as electrical current, voltage, pressure, distance, time etc. are analog in nature. However, for transmission and processing purposes, these variables are often digitally manipulated. Therefore, analog/digital (A/D) and digital/analog (D/A) converters can respectively be considered as coding and decoding devices. The input datum of a D/A converter is represented by a digital value made of several bits, whereas the output may be an analog voltage level corresponding to a digital input value.

Converters are made up by a plurality of stages that can be selected and designed to perform a certain current scaling by varying the sizes of the components of the different stages. Therefore, their performances are strongly dependent on the correct scaling of the physical and/or electrical parameters of the components and on the uniformity of the temperature dependence of such parameters. This makes this type of circuits particularly suited to monolithic integration.

Basically, integrated digital/analog converters (DACs) are based on the principle of current, voltage or electric charge scaling. Among these three classes of converters, the circuits based on current scaling are by far more popular because of their excellent accuracy and speed characteristics.

A current-scaling DAC consists of a set of scaled current generators, for example binarily scaled, which can be selectively summed to produce an analog current output. Usually, currents scaled according to a binary system, are generated by connecting a resistive (scale) network to the source of a constant reference voltage, the taps of this network being selectable by transistor switches, the state of which simulate the coefficients (bits) of the digital datum.

The output current can be summed on a virtual ground node that may coincide with an inverting input node of an operational amplifier provided with a feedback resistancy, of a value adequate for setting a certain scale factor in generating the converter output voltage.

An alternative to the most conventional circuit approach known as "voltage switching", where it is the terminal toward the supply rail of the resistive network that is switched, is the so-called "current switching" approach. This consists in commuting the terminal toward the ground node of the network of resistors between the real ground potential of the circuit and a virtual ground potential, represented by the input node of the operational amplifier.

A different configuration of the resistive network that can eliminate the nonnegligible process spread of the resistance values of a conventional binary scaling network (i.e. employing resistors of different values) is the so-called R-2R resistive network. In this type of network, the binary subdivision of currents is obtained through a successive subdivision of the current between a shunt branch (2R) and a series branch (R) of the network. In this way, the currents in the various stages or branches of the network satisfy the binary expression:

$$I1 = 2I2 = 4I3 = \ldots = 2^{N-1}I_N$$

While keeping the value of the resistors within an easily handled ratio of 2:1. By contrast, the R-2R resistive network requires twice as many resistors compared to a conventional binary resistive network and must be terminated with a resistor that fixes the scale factor.

These aspects of digital/analog converter circuits thorough analysis of the different classes of converter circuits are disclosed in the volume entitled: "Bipolar and MOS Analog Integrate Circuit Design" by Alan P. Grebene, John Wiley & Sons, Chapter 14, pages 353–823, and in the references cited therein. The pertinent description is herewith incorporated by express reference.

Fundamental characteristics of a DAC such as its resolution and accuracy are determined by the actual value of error factors and by intrinsic characteristics of the circuit.

If we consider a DAC as a circuit operating according to the following mathematical function:

$$Y = \psi(X)$$

where X is a digital input datum (word) and Y is the analog output current (or voltage) and $\psi(.)$ is the conversion function implemented by the DAC, which is closely related to its circuital structure. In such a case, if the digital word X is coded in a binary system, then:

$$Y = \Psi(X) = \Psi\left(\frac{\sum_{i=0}^{n-1} x_i 2^i}{2^n}\right)$$

Where n is the length (in bits) of the word and the coefficients $x_i$ (each having a logic value 0 or 1) represent the binary word. The coefficient $x_1$ relates to the Most Significant Bit (MSB) whereas the coefficient $x_n$ relates to the Least Significant Bit (LSB).

By considering the factors of nonlinearity of a DAC, the equation (3) should be modified as follows:

$$Y = (1 + \epsilon_{gain}) \cdot Y\left(\frac{\sum_{i=0}^{n-1} x_i(2^i + \epsilon_i)}{2^n}\right) + O_{offset}$$

In this equation, $\epsilon_{gain}$ is the gain error, $\epsilon_i$ represents the error of the bit weights and $O_{offset}$ is the offset error. Usually, the gain and offset errors may be reduced to zero by means of conventional adjustment techniques. The remaining factors of nonlinearity are commonly expressed in terms of "integral nonlinearity" and/or of "differential nonlinearity" and of "monotonicity."

The latter characteristics define the linearity or near-linearity range of operation of the converter. The breath of this range becomes particularly important in the specific case of a DAC having a quadratic characteristic (DACQ), which is designed to produce an analog output signal corresponding to a quadratic function of a digital input datum. In applications requiring a high speed of conversion, as in the case of DACs used in control loops, the speed of the converter or the so-called settling time becomes of paramount importance.

The settling time is the time required for the DAC to settle within an established error interval (normally ±½ LSB) of the final value, in response to a change in the digital input code (input datum). This delay is determined by the switching times of the internal logic circuitry and above all by the settling time of the circuit transients that is strongly dependent on the parasitic capacitance of the circuit nodes.

Among the mentioned classes of DAC circuits, those functioning in a "current switching mode" with a current output, that is not employing an operational amplifier for summing currents, are recognized as being the fastest. These circuits can settle within an error band of +½ LSB in less than 300 nsec. By contrast, in a DAC functioning in a "voltage switching" mode, that is employing a current summing operational amplifier for producing a voltage output, the settling time is normally of several microseconds due to the slew rate and settling characteristics of the amplifier. Obviously, the settling time is primarily influenced by the settling process relative to the most significant bit (MSB) since the settling times associated with lower order bits are normally negligible.

In most applications, a quadratic digital/analog converter offers important advantages compared to a linear digital/analog converter. A most important and evident advantage is a higher precision; this because in a linear converter the steps' amplitude is uniform whereas in a quadratic converter the steps' amplitude varies according to a quadratic function. This permits a higher conversion precision throughout the dynamic range of variation of the analog signal. However, in quadratic converters (DACQ) the problem of the settling time becomes more severe due to the increased complexity of the circuit.

According to a first approach, a quadratic digital/analog converter (DACQ) can be realized by employing a multiplier circuit in cascade to a linear digital/analog converter (DAC). For instance, a high precision multiplier as described in the U.S. patent application Ser. No. 08/575,872 filed on 27 Dec., 1995, by the present applicant, may be satisfactorily used.

This approach requires an analog multiplier circuit of high precision, which is relatively complex. Moreover, the need of using currents mirrors for compensating errors due to the base currents of transistors and of keeping low the current consumption leads to the use of circuits with high impedance nodes and with long settling times that make the DACQ excessively slow.

Figure 1:
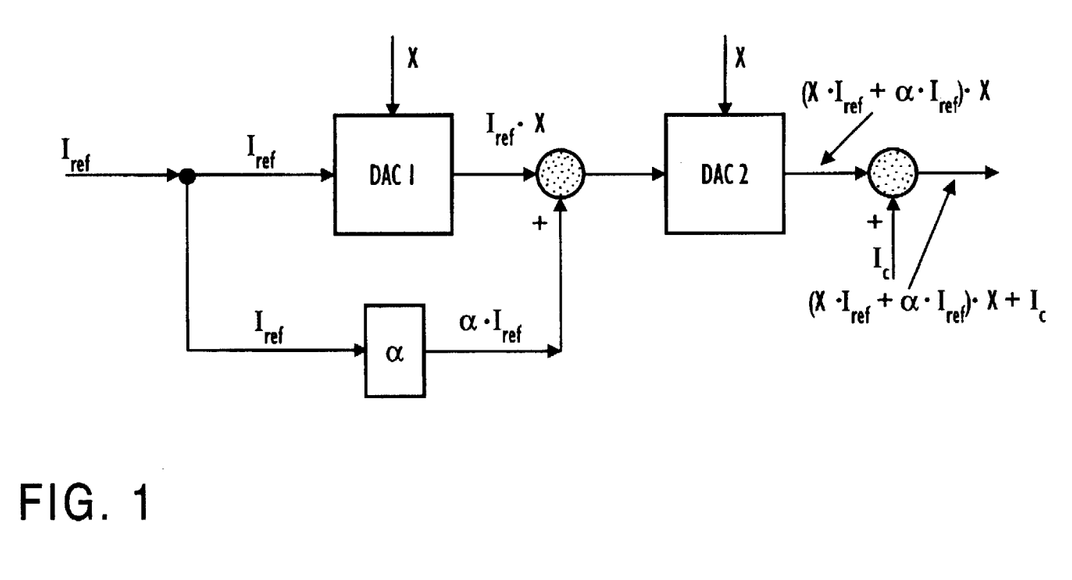
FIG. 1 represents a block diagram of a quadratic digital/analog converter (DACQ) according to a known practice as described above.

A different approach is based on the use of a pair of linear analog/digital converters in cascade defining a quadratic transfer function of the following type:

$$\psi(x)=A*X^2+B*X+C$$

where A, B and C are coefficients closely related to the particular circuit architecture. The known circuital solutions based on this approach practically lead to a block diagram as shown in FIG. 1.

The high impedance of the input node of the linear DACs and in the specific case that of a second linear DAC (DAC2), dictates the use of a current mirror circuit necessarily provided with base current recovery and therefore provided with a local feedback for injecting on the input node of the DAC2 of a current, sum of the output current of the first DAC (DAC1) and of a current multiple of a reference current. This implies long settling times due to the large capacitance of the nodes, with negative repercussions on the speed of the circuit.

SUMMARY OF THE INVENTION

It has now been found that the limitations and problems of the known circuits that realize a digital/analog quadratic converter can be overcome without increasing current consumption, but rather reducing it, by employing a pair of linear digital/analog converters in cascade.

This is achieved by a peculiar circuit architecture, consisting in connecting the output node of the first linear DAC directly to the node of an R-2R resistive network corresponding to the least significant bit (LSB) of the second linear digital/analog converter, and in injecting on the same node a current that is a multiple of a reference current that is forced on the input of the first linear digital/analog converter.

All this eliminates the need to use a current mirror circuit with current recovery that would otherwise be necessary for the coupling with the input node of the second liner digital/analog linear converter. This also eliminates the need for a local feedback capacitance that constitutes a nonnegligible cause of a further increment of the settling times. Moreover, the whole circuit of the quadratic digital/analog converter is decisively simplified providing thus reducing power consumption.

In practical terms, the output current of the first linear digital/analog converter encounters on its path a relatively low impedance, thus avoiding to inject this current on the high-impedance input node on the second linear digital/analog converter. This decisively improves settling-time characteristics.

Moreover, the presence of an output current mirror circuit further improves settling times for the same current dissipation.

BRIEF DESCRIPTION OF THE DRAWINGS

The different aspects and relative advantages of this invention will become even clearer through the following description of an important embodiment and by referring to the attached drawings, wherein.

DESCRIPTION OF PREFERRED EMBODIMENTS

Figure 3A:
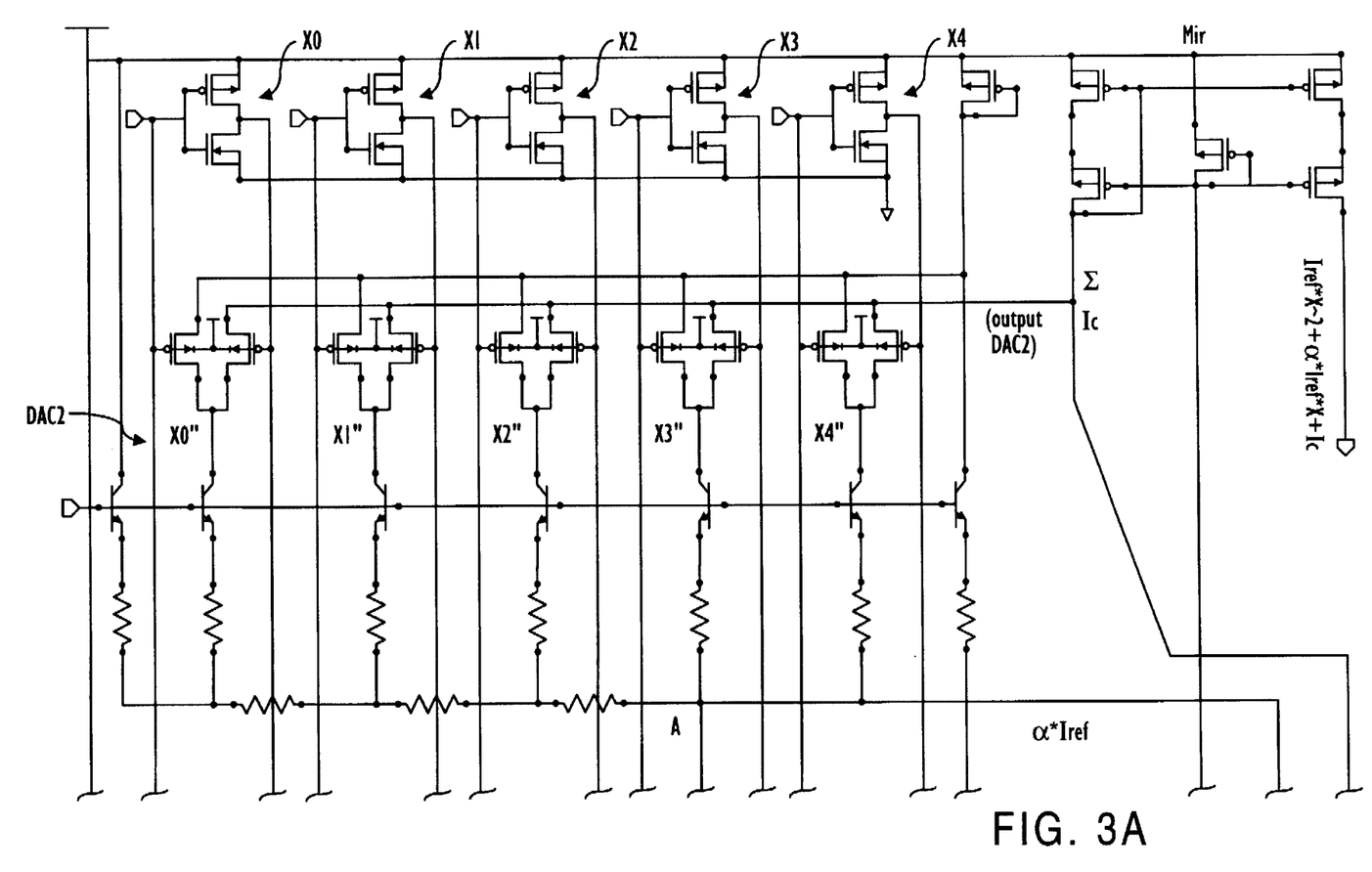
FIGS. 3A and 3B together show a circuit diagram of a DACQ functionally equivalent to that of FIGS. 2A and 2B but designed according to the invention.
Figure 3B:
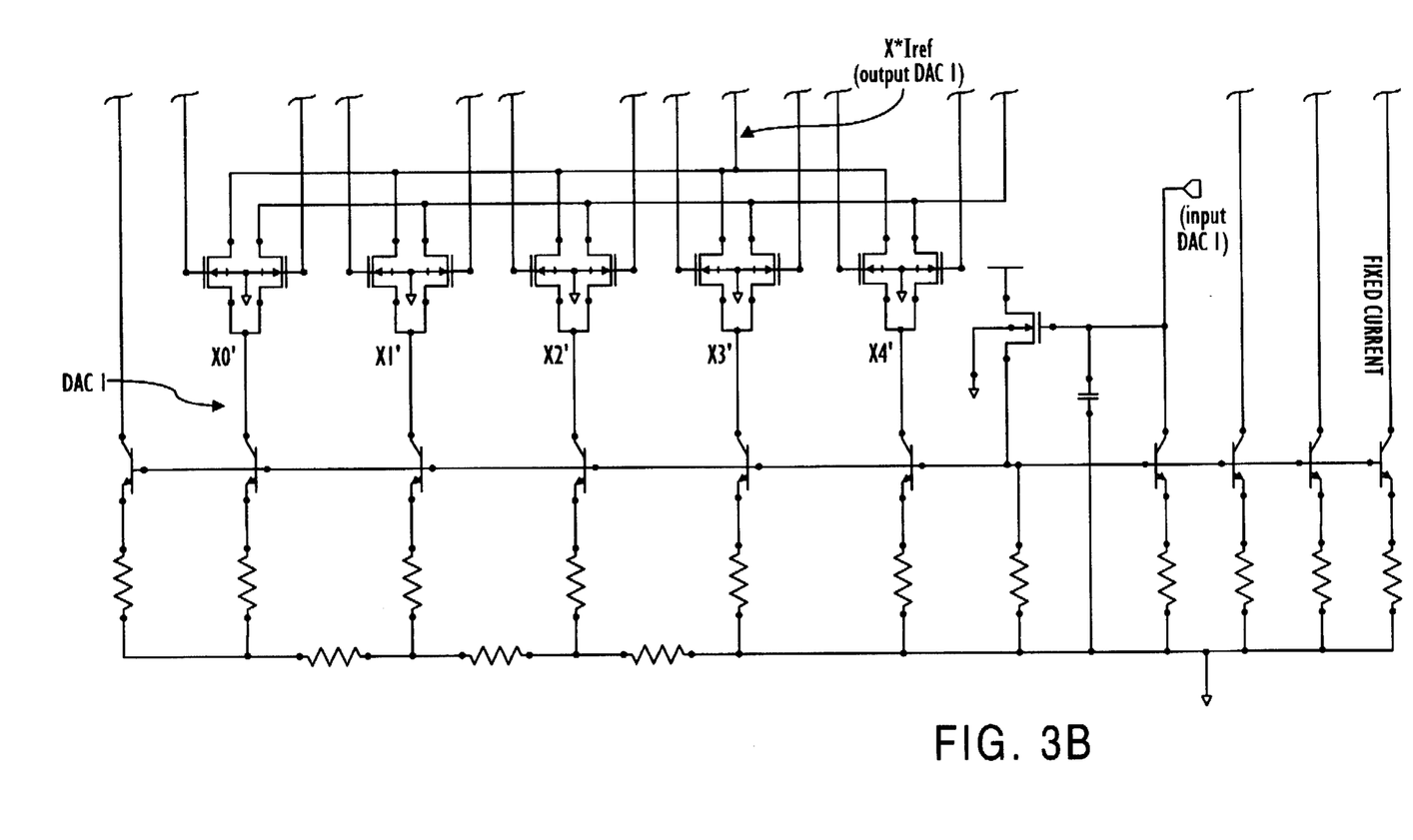

A quadratic digital/analog converter implementing the block diagram of FIG. 1, may be realized according to the known practice as shown in FIGS. 3A and 3B for purpose of comparison with the characteristics of the circuit arrangement of the invention.

In the case of example shown of a four bit converter with an additional control bit, the electrical layout includes five input inverters of the digital datum, identified by X0, X1, X2, X3, and X4, for driving in parallel as many pass gates X0', X1', X2', X3' and X4' and X0", X1", X2", X3", and X4", respectively, of a first and of a second linear digital/analog converters based on an R-2R resistive network. The two converters are identified as a whole as DAC1 and DAC2, respectively.

The circuit scheme of both linear DACs (DAC1 and DAC2) is of the "voltage switching" type, employing a resistive network made up by the series resistors R and by the parallel resistors 2R. The R-2R network and the scaled current generators, constituted by NPN transistors of scaled emitter areas biased at the same voltage, generate binary scaled currents (as clearly shown in the scheme of FIGS. 2A and 2B).

According to the block diagram of FIG. 1, the output X*Iref produced by the first linear DAC (DAC1) is summed on the node Σ1 with a current α*Iref and through a current mirror Mir1, the sum of these currents is forced on the input node (node B) of the second linear DAC (DAC2). The output current of the second linear DAC (DAC2) Iref*$X^2$+ α*Iref*X is summed on the node Σ2 with a constant current Ic, and the resulting sum current output is delivered through a second current mirror circuit Mir2.

The driving of the high impedance input node (B) of the second linear DAC (B) requires the implementation of a local feedback through the compensation capacitance C2. This accentuates the persistence of settling phenomena with negative effects on the maximum operating speed, on the reliability of the converter and on energy consumption.

As previously mentioned this drawback is effectively and simply overcome by using a circuit as shown in FIGS. 3A and 3B. From this figure it can be said that both linear DACs, even if they have an inverted position in the diagram, are equivalent in terms of operating and circuital characteristics to the linear DACs of FIGS. 2A and 2B.

Figure 2A:
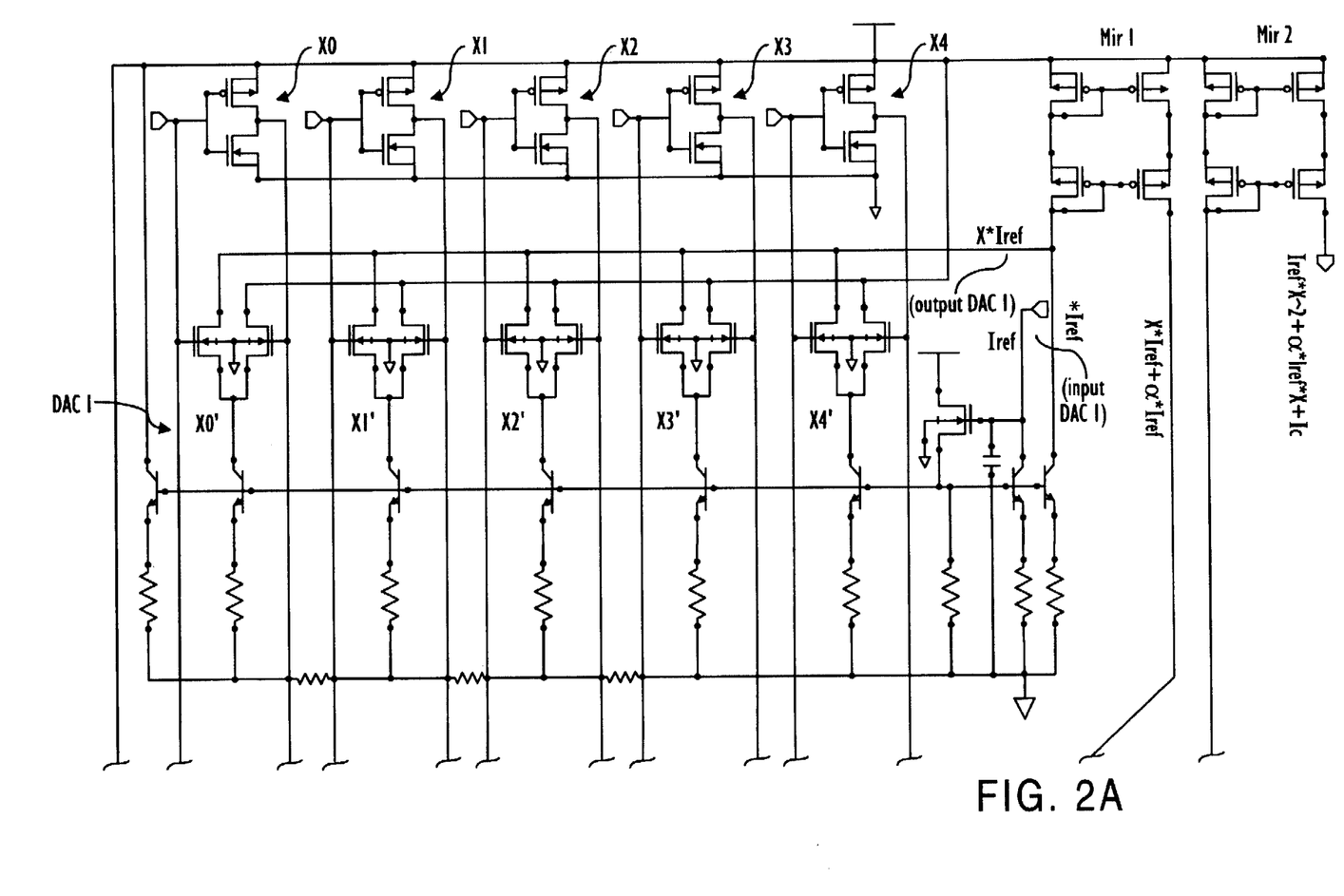
FIGS. 2A and 2B together show a circuit diagram of a DACQ implementing the functional scheme of FIG. 1.
Figure 2B:
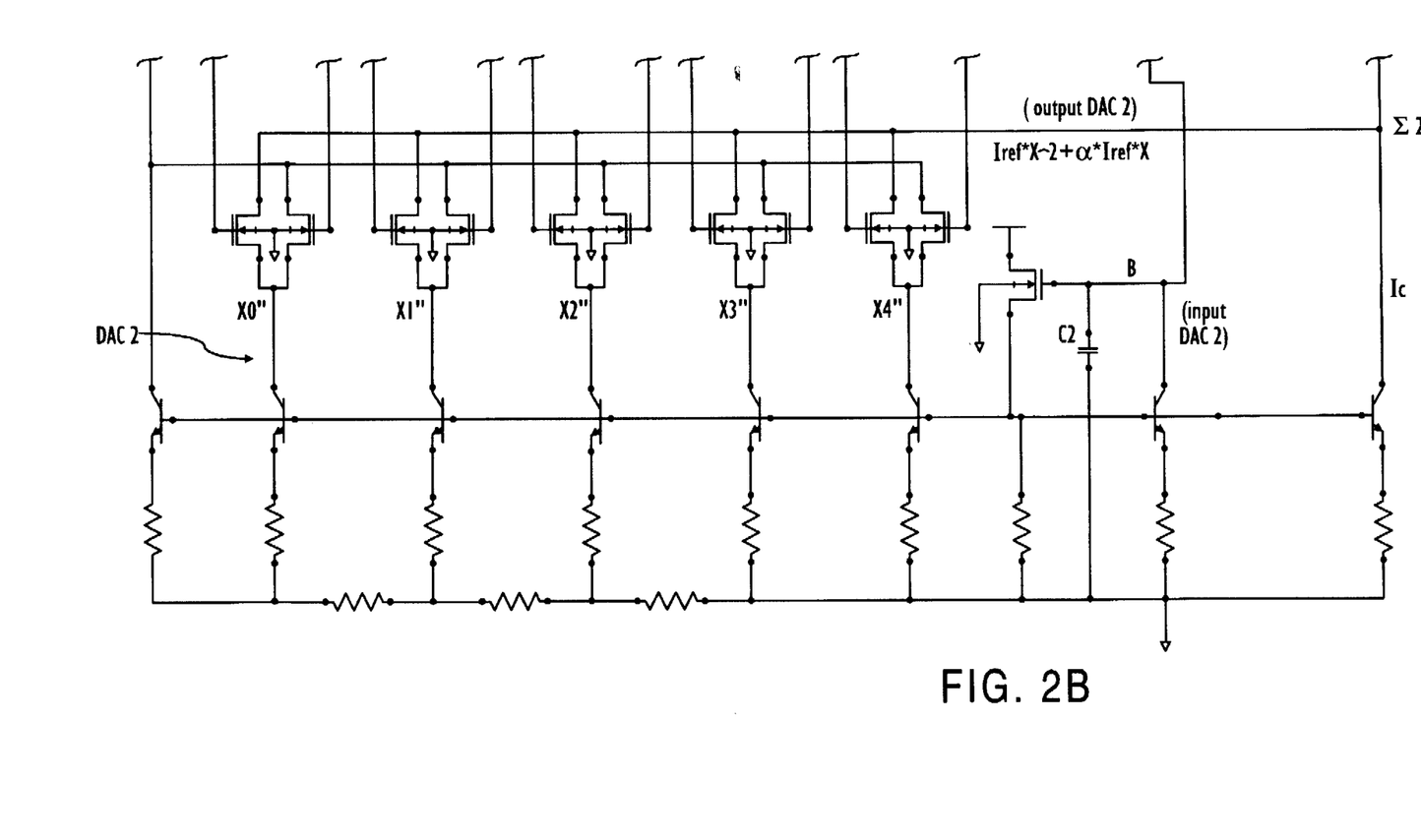

However, differently from FIGS. 2A and 2B, the output node of the first converter DAC1 is directly connected to the node (A) of the R-2R resistive network of the second converter DAC2. In coincidence with the LSB stage of the resistive network for the binary subdivision of the current. On this same node (A) is then summed a current that is a multiple of the reference current Iref which is injected on the input node of the first converter DAC1, α*Iref.

The output current of the second converter DAC2 is summed on node Σ with a constant current Ic and a current recovering mirror Mir outputs a current whose value is a quadratic function of the digital datum X applied to the linear converters DAC1 and DAC2 through the inverters X0, X1, X2, X3 and X4.

Evidently the circuit in its whole is simplified and the output current of the first converter DAC1, (X*Iref), encounters on its path low impedance nodes which do not imply considerable settling phenomena upon switching. In practice, this avoids the need of injecting the current output by the first converter DAC1, after summing it with a current that is a multiple of the reference current, through the high-impedance input node of the second converter DAC2, by linking the R-2R resistive network of the second converter to the potential of the output node of the first converter DAC1 instead of linking it to ground.

Practically, the linear converters DAC1 and DAC2 are electrically in series, in other words the second converter DAC2 is electrically biased in series to the first converter DAC1 that is in turn linked to the ground node. It is evident how this arrangement implies a considerable reduction of current paths, with an attendant reduction of power consumption.

Structurally, the selection gates of the DAC1 being linked to ground potential of the circuit are preferably made with n-channel devices, thus accentuating the speed characteristics. By contrast, the selection gates of the second converter DAC2, operating at a potential closer to the supply voltage, are preferably made with p-channel devices (as schematically shown in FIGS. 3A and 3B). Even if this is not an essential condition it is however preferred when integrating the circuit according to standard CMOS fabrication processes.

The enhanced operational speed characteristics of the quadratic converter of this invention are particularly useful in control and regulation loops (even if not exclusively in those applications). An example of application may consist in the implementation of a control loop for the cut-off frequency (Fc) and for the gain boost of a filter for a READ/WRITE data channel to and from a mass memory device, as for example a hard disk drive for a P.C.

Figures 4, 5:
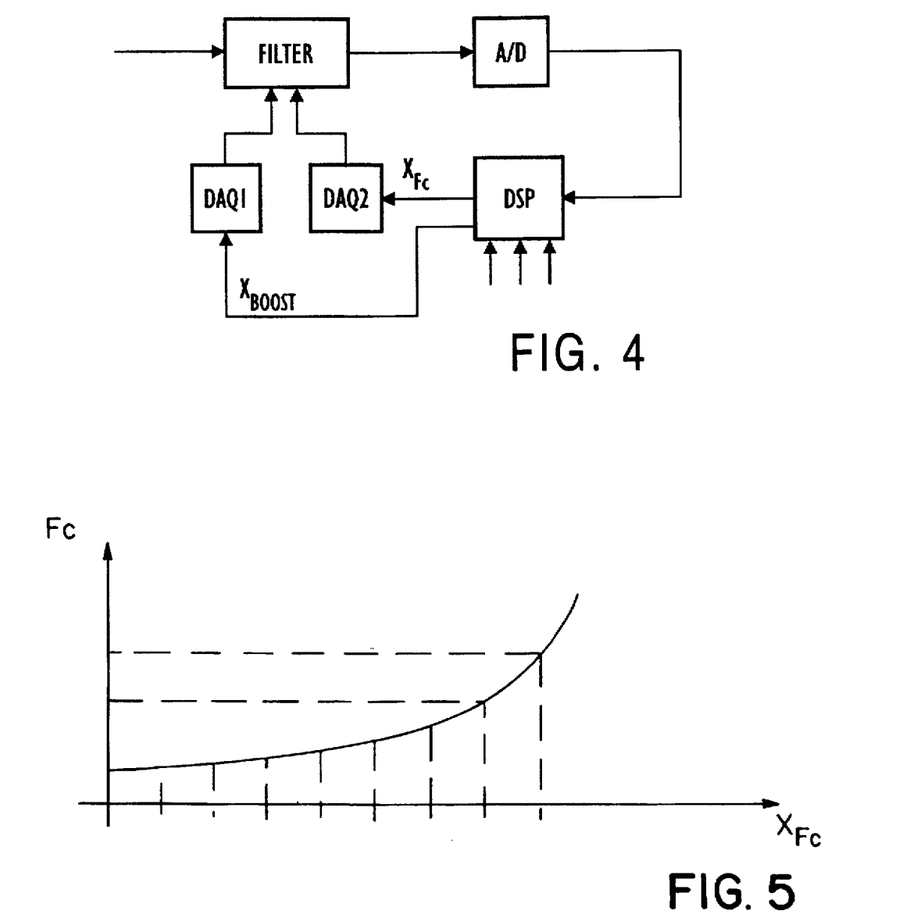
FIG. 4 is a block diagram of an adaptive control loop using DACQ converters according to the present invention.
FIG. 5 is a diagram showing the function of the control loop of FIG. 4.
Figure 6:
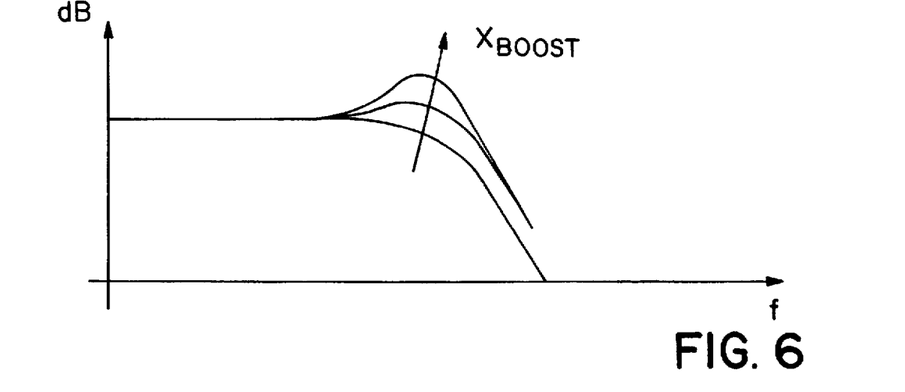
FIG. 6 is another diagram of the function of the control loop of FIG. 4.

The typical control loop for this specific application is illustrated in FIG. 4. The DSP block is a circuit that can carry out an algorithm for making the channel adaptive. The processing performed in the DSP block, an input of which is constituted by a digital signal produced by an analog/digital converter (ADC), produces the digital control data $X_{Fc}$ and $X_{Boost}$, which are applied to two digital/analog quadratic converters (DACQ1 and DACQ2). The output signals of these two quadratic converters control in order the cut-off frequency (Fc) and the boost of the filter, respectively, in order to attain the operating characteristics described in FIG. 5 and FIG. 6 by way of diagrams.

Of course, quadratic converters made according to the present invention are useful in any application requiring high speed processing and reduced power consumption.

We claim:

1. A digital/analog quadratic converter (DACQ) comprising a pair of current scaling digital/analog converters (DAC1, DAC2) having the same number of stages (bits) and functionally connected in cascade, each employing DAC employs the same number of binarily scaled current sources that my be selected by a certain digital datum or word (X) of said number of bits and an R-2R resistive network, a reference current (Iref) being forced on a high impedance input node of the first converter (DAC1), first means for summing an output current of the first converter (Iref*X) with a current multiple of said reference current (α*Iref), and second means for summing an output current ((X*Iref+α*Iref)*X) of the second converter (DAC2) with a constant current (Ic) to produce an output current defined by a quadratic function (Iref*$X^2$+α*Iref*X+Ic) of said digital datum (X), characterized in that said first means consists of a direct coupling of the output node of the first converter (DAC1) with a node of said R-2R resistive network of said second converter corresponding to the least significant bit stage of said R-2R network of the second converter (DAC2), on which node said current of multiple value (X*Iref) is summed.

2. A converter (DACQ) as defined in claim 1, characterized in that said R-2R resistive network, is made of a succession of resistors R connected in series and by a plurality of Shunt resistors 2R of a number equal to the said number of bits.

3. A converter according to claim 1, characterized in that a generator of a binarily scaled current for each shunt branch of said R-2R network corresponding to the same number of bits is connected in series to each of said shunt resistors.

4. A converter as defined in claim 3, wherein each current generator is formed by a bipolar transistor having a binarily scaled emitter area compared to that of the transistors of the other shunt branches, and having a polarized base with a reference voltage common to all the mentioned generating transistors.

5. A converter as defined in claim 1, characterized in that the selection of binary scaled current sources takes place in both mentioned linear converters in cascade through a number of switching gates corresponding in number to the number of said current sources, being the switching gate of a certain order of one of the linear converter driven in common with the switching gate of the same order of the other linear converter through a unique driving inverter to an input node of which is applied the relative logic value of a bit of said digital datum (X).

6. A quadratic digital/analog converter circuit, comprising:
first and second analog to digital converter stages jointly connected in series between a power supply line and a ground voltage;
said first and second converter stages each having a plurality of digital gates connected to selectably apply a current to an output connection of the converter stage, in dependence on a respective input bit of a digital input word, and in dependence on a current reference input of the converter stage;
corresponding ones of said gates of said first and second converter stages being connected to receive corresponding bits of the same digital input word;
said first and second converter stages having matching circuit topologies, with said output connection of said first converter stage being connected to said current reference input of said second converter stage;
wherein said gates of said first converter stage are implemented with transistors having a first conductivity type, and said gates of said second converter stage are implemented with field effects transistors of a second conductivity type.

7. The converter circuit of claim 6, wherein each said converter stage is of the R/2R type.

8. The converter circuit of claim 6, wherein said reference current input of said second converter stage is connected directly to an LSB portion of said second converter stage.

9. The converter circuit of claim 6, wherein each said gate comprises a pair of field-effect transistors with sources thereof connected together, and gates connected to receive complementary signals.

10. The converter circuit of claim 6, wherein said gates of said first converter stage are implemented with PMOS transistors, and said gates of said second converter stage are implemented with NMOS transistors.

11. The converter circuit of claim 6, wherein the digital input word includes exactly five bits.

12. A quadratic digital/analog converter circuit, comprising:
first and second analog to digital converter stages jointly connected in series between a power supply line and a ground voltage;
said first and second converter stages each having a plurality of digital gates connected to selectably apply a current to an output connection of the converter stage, in dependence on a respective input bit of a digital input word, and in dependence on a current reference input of the converter stage;
corresponding ones of said gates of said first and second converter stages being connected to receive corresponding bits of the same digital input word;
said first and second converter stages having matching circuit topologies, with said output connection of said first converter stage being connected to said current reference input of said second converter stage, without any intervening current mirror.

13. The converter circuit of claim 12, wherein said reference current input of said second converter stage is connected directly to an LSB portion of said second converter stage.

14. The converter circuit of claim 12, wherein each said converter stage is of the R/2R type.

15. The converter circuit of claim 12, wherein said gates of said first converter stage are implemented with PMOS transistors, and said gates of said second converter stage are implemented with NMOS transistors.

16. The converter circuit of claim 12, wherein the digital input word includes exactly five bits.

17. The converter circuit of claim 12, wherein each said gate comprises a pair of field-effect transistors with sources thereof connected together, and gates connected to receive complementary signals.

18. An analog control loop circuit acting in response to a quadratic function of a variable digital control value, comprising:
at least one digital/analog quadratic converter; wherein said digital/analog quadratic converter comprises:
first and second converters functionally connected in cascade, said first and second converters being current scaling digital/analog converters having the same number of stages and employing the same number of binarily scaled current sources, said binarily scaled current sources selectable by a digital word;
first and second R-2R resistive networks of said first and second converters, respectively;
a reference current being forced on a high impedance input node of said first converter;
a first circuit for summing a first output current of said first converter with a current multiple of said reference current; and
a second circuit for summing a second output current of said second converter with a constant current to produce a third output current defined by a quadratic function of said digital datum;
wherein said first circuit is coupled to an output node of said first converter and to a first node of said second R-2R resistive network, said second R-2R resistive network corresponding to a least-significant-bit stage of said second converter, said current multiple is summed on said first node.

19. A control loop for regulating boost and cut-off frequency of an analog filter, comprising:
an analog/digital converter for converting an analog output signal of said analog filter into a digital datum;
a digital processing circuit for receiving said digital datum; and
at least a pair of digital/analog quadratic converters controlled by output data of said digital processing circuit, and capable of generating analog signals for regulating said cut-off frequency and said boost of said analog filter; wherein each said digital/analog quadratic converter comprises:
first and second converters functionally connected in cascade, said first and second converters being current scaling digital/analog converters having the same number of stages and employing the same number of binarily scaled current sources, said binarily scaled current sources selectable by a digital word;
first and second R-2R resistive networks of said first and second converters, respectively;
a reference current being forced on a high impedance input node of said first converter;
a first circuit for summing a first output current of said first converter with a current multiple of said reference current; and a second circuit for summing a second output current of said second converter with a constant current to produce a third output current defined by a quadratic function of said digital datum;

wherein said first circuit is coupled to an output node of said first converter and to a first node of said second R-2R resistive network, said second R-2R resistive network corresponding to a least-significant-bit stage of said second converter, said current multiple is summed on said first node.

20. A controllable analog filter circuit, comprising:

an analog filter;

an analog/digital converter for converting an analog output signal of said analog filter into a digital datum;

first and second digital/analog quadratic converter circuits operatively interconnected, wherein each said converter circuit comprises:

first and second analog/digital converter stages jointly connected in series between a power supply line and a ground voltage;

said first and second converter stages each having a plurality of digital gates connected to selectably apply a current to an output connection of the converter stage, in dependence on a respective input bit of a digital input word, and in dependence on a current reference input of the converter stage;

corresponding ones of said gates of said first and second converter stages being connected to receive corresponding bits of the same digital input word;

said first and second converter stages having matching circuit topologies, with said output connection of said first converter stage being connected to said current reference input of said second converter stage, without any intervening current mirror; and a digital processing circuit for receiving said digital datum, and for controlling said first and second digital/analog quadratic converter circuits;

wherein said first digital/analog quadratic converter circuit controls boost of said analog filter, and said second digital/analog quadratic converter circuit controls cut-off frequency of said analog filter.

* * * * *